March 19, 1968 C. F. HEALD 3,374,437
SQUELCH SYSTEM FOR RADIO RECEIVERS
Filed Aug. 26, 1964
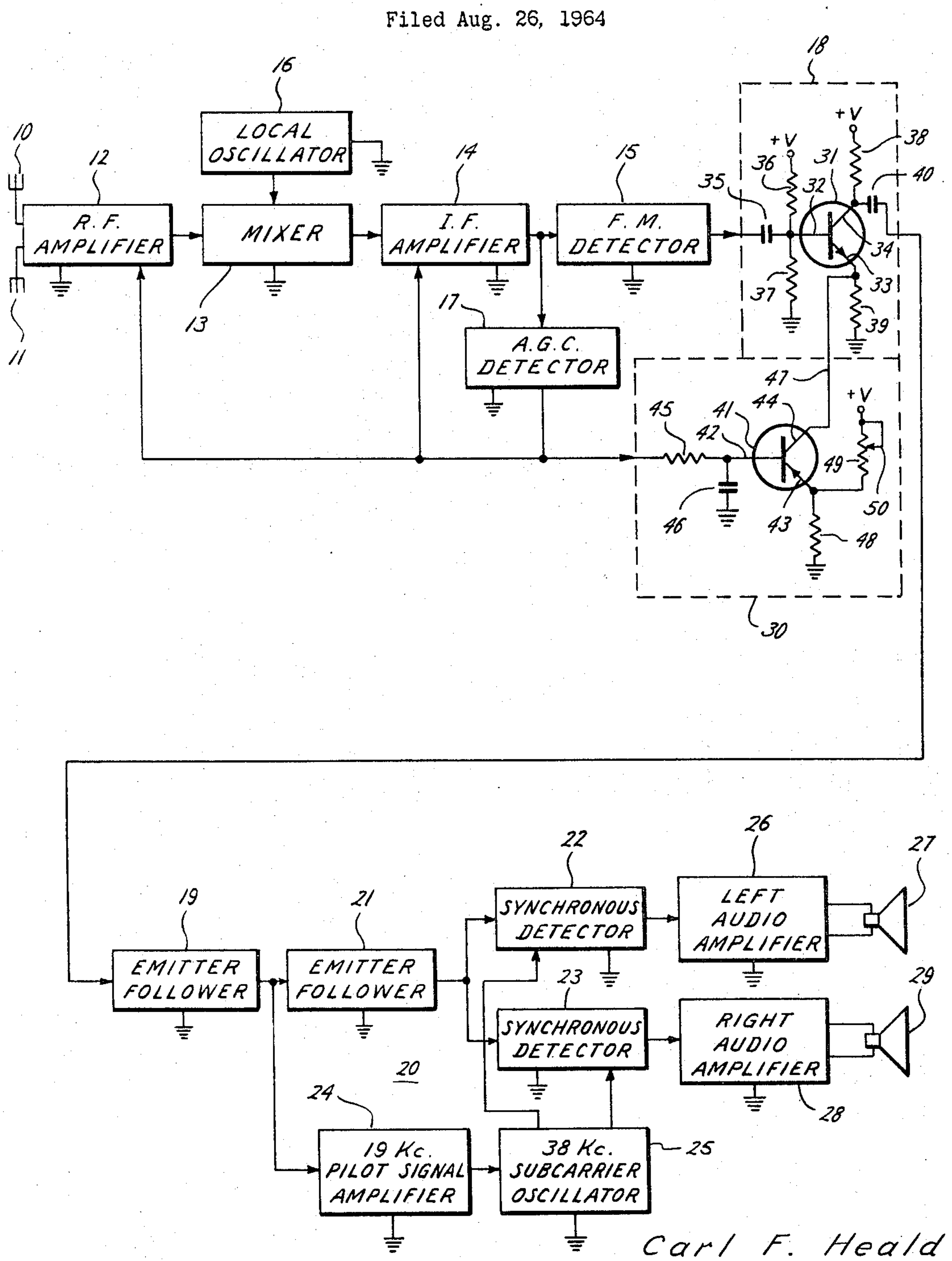
Carl F. Heald
INVENTOR.
BY Richard E. Bee
ATTORNEY United States Patent Office 3,374,437
Patented Mar. 19, 1968

3,374,437

SQUELCH SYSTEM FOR RADIO RECEIVERS

Carl F. Heald, St. Joseph, Mich., assignor to Heath Company, St. Joseph, Mich., a corporation of Delaware Filed Aug. 26, 1964, Ser. No. 392,159
3 Claims. (Cl. 325—478)

ABSTRACT OF THE DISCLOSURE

A squelch system for use in radio receivers. A squelch control transistor 41 is responsive to the receiver AGC voltage and acts to cut off a signal amplifier transistor 31 whenever the received radio signal carrier level falls below a preset value.

This invention relates to squelch systems for radio receivers. It is particularly useful in transistorized FM receivers and FM stereo receivers.

Squelch systems are useful in radio receivers for disabling the receiver when tuning between stations. This prevents "off station" noise from passing through to the loudspeakers.

It is an object of the invention to provide a new and improved squelch system which is very sensitive and very fast acting.

It is another object of the invention to provide a new and improved squelch system which introduces very little, if any, phase distortion into the program signal.

It is a further object of the invention to provide a new and improved transistorized squelch system wherein transistors may be interchanged or replaced without causing any difficulties in circuit operation.

In accordance with the invention, a squelch system for a radio receiver comprises a signal amplifier circuit including a signal transistor having emitter, base and collector electrodes for amplifying the detected radio signal. To this end, the base electrode is coupled to an earlier stage in the receiver and the collector electrode is coupled to a later stage in the receiver. The system also includes circuit means for supplying a gain control signal proportional to the received carrier signal level. The system further includes a control amplifier circuit including a control transistor having emitter, base and collector electrodes for amplifying the gain control signal, the base electrode being coupled to the gain control signal supply circuit means and the collector electrode being connected directly to the emitter electrode of the signal transistor. The system additionally includes bias circuit means connected to the emitter electrode of the control transistor for causing the control transistor to be disabled over a portion of the gain control signal range.

For a better understanding of the present invention, together with other and further objects thereof, reference is had to the following description taken in connection with the accompanying drawing, the scope of the invention being pointed out in the appended claims.

The single figure of the drawing is a circuit diagram, partly schematic, of an FM stereo receiver including a representative embodiment of a squelch system constructed in accordance with the present invention.

Referring to the drawing, there is shown a radio receiver of the FM (frequency modulation) stereo type. Such receiver may be completely transistorized thoughout. The reeciver includes an antenna system 10, 11, a radio-frequency (R.F.) amplifier 12, a mixer circuit 13, an intermediate-frequency (I.F.) amplifier 14, and a frequency modulation (FM) detector 15. A local oscillator 16 is coupled to the mixer 13 to obtain the desired 10.7 mc. I.F. signal. An AGC (automatic gain control) detector 17 is connected to the output of I.F. amplifier 14 for developing a variable positive-polarity direct-current gain control signal which is proportional in magnitude to the level of the received FM carrier signal. Detector 17 may include a stage of amplification therein, if necessary. The gain control signal from detector 17 is supplied to the R.F. amplifier 12 and the I.F. amplifier 14 for controlling the gains thereof so as to hold the signal level supplied to the FM detector 15 more nearly constant.

The detected modulation signal appearing at the output of FM detector 15 is supplied by way of an amplifier circuit 18 and an emitter follower circuit 19 to a stereo multiplex converter system 20. The multiplex converter 20 includes an emitter follower 21 for supplying the detected modulation signal to a pair of synchronous detectors 22 and 23. The multiplex converter 20 also includes a pilot signal amplifier 24, which is sharply tuned to the 19 kc. pilot signal frequency, and a subcarrier oscillator 25, which generates a sinusoidal signal at the 38 kc. subcarrier center frequency. The 19 kc. signal from amplifier 24 is supplied to the subcarrier oscillator 25 to synchronize the 38 kc. signal generated therein with the received 19 kc. pilot signal. Oscillator 25 supplies an in-phase or 0°-phase 38 kc. reference signal to the synchronous detector 22 and a reverse-phase or 180°-phase 38 kc. reference signal to the synchronous detector 23. The left channel audio signal appearing at the output of synchronous detector 22 is supplied by way of an audio amplifier 26 to a loudspeaker 27. The right channel audio signal appearing at the output of synchronous detector 23 is supplied by way of an audio amplifier 28 to a second loudspeaker 29.

The squelch system of the present invention includes, in the illustrated embodiment, a squelch control circuit 30 which is responsive to the gain control signal appearing at the output of AGC detector 17 for disabling the amplifier circuit 18 whenever the receiver is being tuned and is between stations. The squelch control circuit 30 is a form of direct-current amplifier having a biasing network which limits the operation of the amplifier to a portion of the gain control signal range.

Considering first the details of the amplifier circuit 18, such circuit includes an electron device 31 in the form of an NPN silicon transistor having a base electrode 32, an emitter electrode 33 and a collector electrode 34. The base electrode 32 is coupled to the output of the FM detector 15 by way of a coupling capacitor 35. A pair of resistors 36 and 37 form a voltage divider network to supply a bias voltage to the base electrode 32. The upper end of resistor 36 is connected to a voltage supply source +V, while the lower end of resistor 37 is connected to chassis ground, the midpoint between resistors 36 and 37 being connected to the base electrode 32. The resistance values of resistors 36 and 37 are relatively low to keep the base electrode bias voltage relatively constant. The collector electrode 34 of transistor 31 is connected by way of a collector load resistor 38 to the supply voltage source +V. The emitter electrode 33 is coupled by way of an emitter resistor 39 to chassis ground. The collector electrode 34 is also coupled by way of a coupling capacitor 40 to the following receiver stage, namely, the emitter follower 19. Input and output coupling capacitors 35 and 40 are provided with relatively large capacitance values in order to prevent phase distortion of the low frequency components of the detected modulation signal during its passage or translation through the amplifier circuit 18.

Considering now the squelch control circuit 30, such circuit includes an electron device 41 in the form of a PNP germanium transistor having a base electrode 42, an emitter electrode 43 and a collector electrode 44. The base electrode 42 is coupled to the output of the AGC detector 17 by way of a resistor 45. A bypass capacitor 46 is connected between the base electrode 42 and chassis ground. Together, resistor 45 and capacitor 46 constitute a low-pass filter for preventing any appreciable 10.7 mc. I.F. component from reaching the transistor 41. The collector electrode 44 of transistor 41 is connected by way of a conductor 47 to the emitter electrode 33 of transistor 31. The emitter electrode 43 of transistor 41 is connected by way of a resistor 48 to chassis ground. The emitter 43 is also connected by way of a potentiometer 49 to the voltage supply source +V. A sliding tap 50 on the potentiometer 49 is connected to the upper side of the potentiometer resistor 49. The resistance values for resistor 48 and potentiometer resistor 49 are selected to be relatively small so that the emitter bias voltage appearing at the junction therebetween will remain fairly constant. As will be seen, the setting of sliding tap 50 determines the threshold level for the squelching action.

Considering now the operation of the squelch system, in the present embodiment the AGC gain control voltage appearing at the output of AGC detector 17 is a positive-polarity direct-current voltage which increases in magnitude as the received carrier signal level increases. This positive-polarity gain control voltage is supplied to the base electrode 42 of the transistor 41 in the squelch control circuit 30. At the same time, there is supplied to the emitter electrode 43 of the transistor 41 a positive-polarity direct-current bias voltage, the magnitude of which is determined by the setting of sliding tap 50 of potentiometer 49. When the gain control voltage at the base electrode 42 is smaller in magnitude than the bias voltage supplied to the emitter electrode 43, then the transistor 41 is conductive and functions as a direct-current amplifier having appreciable gain. When the magnitude of the gain control signal is greater than that of the emitter bias voltage, then transistor 41 is nonconductive.

Since the collector electrode 44 of transistor 41 is connected to the emitter electrode 33 of transistor 31, conduction in the transistor 41 is used to control the operative condition of the transistor 31. In this regard, the emitter resistor 39 of transistor 31 also constitutes the collector load resistor for the transistor 41 in the squelch control circuit 30. The circuit constants are proportioned so that the emitter-to-collector current flow in the transistor 41 is considerably greater than the collector-to-emitter current flow in transistor 31. As a consequence, when transistor 41 is conductive, a relatively large positive voltage drop is developed across the emitter resistor 39 of transistor 31. This biases the transistor 31 to a nonconductive condition. In this condition, no signals will pass from the FM detector 15 through the amplifier 18 to the emitter follower 19. This is the squelched condition.

When the receiver is being tuned and is between stations, no carrier signal is being received and, as a consequence, the gain control voltage at the output of detector 17 is relatively small. As a consequence, transistor 41 is conductive and the resulting voltage drop across emitter resistor 39 biases the transistor 31 to cut-off. This prevents "off station" noise from passing through to the remainder of the receiver and being reproduced by the loudspeakers 27 and 29. When the receiver is tuned to a station, the gain control voltage at the output of detector 17 becomes relatively large. This biases the squelch control transistor 41 to a cut-off condition. This removes the large voltage drop from the emitter resistor 39 and thus enables the amplifier transistor 31 to function in a normal manner as a voltage amplifier.

The sliding tap 50 of potentiometer 49, which constitutes the squelch control, is set just far enough down so that no noise is heard when between stations. If the sliding tap 50 is moved too near the bottom end of potentiometer 49, only very strong stations will be heard. In order to receive a very weak station, it may be necessary to move the sliding tap 50 back toward the upper end of the potentiometer 49.

Amplifier transistor 31 is preferably of the silicon type because of the abrupt cut-off characteristics of such type transistors. This, together with the fact that squelch control transistor 41 is operated as an amplifier, enables even relatively small changes in the gain control voltage to completely squelch the signal passing through the amplifier 18. Also, the squelching action is quite rapid because no capacitors are present in the squelch control path between transistor 41 and transistor 31.

Replacement of either the transistor 31 or the transistor 41 presents no problem, since any difference in operating characteristics for the replacement transistors can be taken into account by the setting of the sliding tap 50. The same consideration applies to any changes in the level of the gain control voltage that might occur because of replacement of components in the AGC detectors 17 or the IF amplifier 14 or the like.

While it is not intended to limit the invention to any particular design constants, the following values have been found suitable for the embodiment of the invention shown in the drawing:

| | | |
|---|---|---|
| Capacitor **35** | microfarads | 50 |
| Capacitor **40** | do | 10 |
| Capacitor **46** | do | 0.05 |
| Resistor **36** | ohms | 68,000 |
| Resistor **37** | do | 10,000 |
| Resistor **38** | do | 680 |
| Resistor **39** | do | 220 |
| Resistor **45** | do | 4700 |
| Resistor **48** | do | 470 |
| Resistor **49** | do | 100 |
| Transistor **31** | | 2N2712 |
| Transistor **41** | | 2N408 |
| Voltage +V | volts | +9.1 |

While there has been described what is at present considered to be a preferred embodiment of this invention, it will be obvious to those skilled in the art that various changes and modifications may be made therein without departing from the invention, and it is, therefore, intended to cover all such changes and modifications as fall within the true spirit and scope of the invention.

What is claimed is:

1. In a radio receiver, a squelch system comprising: a signal amplifier circuit including a signal transistor having emitter, base and collector electrodes for amplifying the detected radio signal, the base electrode being coupled to an earlier stage in the receiver and the collector electrode being coupled to a later stage in the receiver; circuit means for supplying a gain control signal proportional to the received carrier signal level; a control amplifier circuit including a control transistor having emitter, base and collector electrodes for amplifying the gain control signal, the base electrode being coupled to the gain control signal supply circuit means and the collector electrode being connected directly to the emitter electrode of the signal transistor; and bias circuit means connected to the emitter electrode of the control transistor for causing the control transistor to be disabled over a portion of the gain control signal range.

2. In a radio receiver, a squelch system comprising:

a signal amplifier circuit including a signal transistor having sharp cut-off characteristics and having emitter, base and collector electrodes for amplifying the detected radio signal, the base electrode being coupled to an earlier stage in the receiver and the collector electrode being coupled to a later stage in the receiver;

circuit means for supplying a gain control signal proportional to the received carrier signal level;

a control amplifier circuit including a control transistor having emitter, base and collector electrodes for amplifying the gain control signal, the base electrode being coupled to the gain control signal supply circuit means and the collector electrode being connected directly to the emitter electrode of the signal transistor, there being no capacitors connected to either the collector electrode of the control transistor, the emitter electrode of the signal transistor or the circuit connection therebetween;

and bias circuit means connected to the emitter electrode of the control transistor for causing the control transistor to be disabled over a portion of the gain control signal range.

3. In a radio receiver, a squelch system comprising:

a single stage signal amplifier circuit having a silicon type signal transistor of one P-N type having emitter, base and collector electrodes for amplifying the detected radio signal, the base electrode being coupled to an earlier stage in the receiver and the collector electrode being coupled to a later stage in the receiver;

a resistor connected between the emitter electrode of the signal transistor and a point of fixed reference potential;

circuit means for supplying a gain control signal proportional to the received carrier signal level;

a single stage control amplifier circuit having a control transistor of an opposite P-N type having emitter, base and collector electrodes for amplifying the gain control signal, the base electrode being coupled to the gain control signal supply circuit means and the collector electrode being connected directly to the emitter electrode of the signal transistor for disabling the signal transistor when the control transistor is conductive, there being no capacitors connected to either the collector electrode of the control transistor, the emitter electrode of the signal transistor or the circuit connection therebetween;

and adjustable bias circuit means connected to the emitter electrode of the control transistor for causing the control transistor to be disabled whenever the gain control signal exceeds a predetermined value, thereby placing the signal transistor in an operative condition.

References Cited

UNITED STATES PATENTS 3,011,052 11/1961 Busby ---------- 325—478 XR

WILLIAM C. COOPER, *Primary Examiner.*

KATHLEEN H. CLAFFY, *Examiner.*

R. LINN, *Assistant Examiner.*